(12) United States Patent
Aoki et al.

(10) Patent No.: US 10,038,207 B2
(45) Date of Patent: Jul. 31, 2018

(54) FUEL CELL SYSTEM

(71) Applicant: NISSAN MOTOR CO., LTD., Yokohama-shi, Kanagawa (JP)

(72) Inventors: Tetsuya Aoki, Kanagawa (JP); Michihiko Matsumoto, Kanagawa (JP); Youhei Kaneko, Kanagawa (JP)

(73) Assignee: NISSAN MOTOR CO., LTD., Yokohama-shi (JP)

( * ) Notice: Subject to any disclaimer, the term of this patent is extended or adjusted under 35 U.S.C. 154(b) by 29 days.

(21) Appl. No.: 15/114,171

(22) PCT Filed: Dec. 15, 2014

(86) PCT No.: PCT/JP2014/083097
§ 371 (c)(1),
(2) Date: Jul. 26, 2016

(87) PCT Pub. No.: WO2015/114968
PCT Pub. Date: Aug. 6, 2015

(65) Prior Publication Data
US 2017/0012305 A1    Jan. 12, 2017

(30) Foreign Application Priority Data
Jan. 30, 2014   (JP) ................ 2014-015772

(51) Int. Cl.
*H01M 8/04828* (2016.01)
*H01M 8/04791* (2016.01)
(Continued)

(52) U.S. Cl.
CPC .......... *H01M 8/0485* (2013.01); *G01R 27/02* (2013.01); *G01R 31/00* (2013.01);
(Continued)

(58) Field of Classification Search
CPC combination set(s) only.
See application file for complete search history.

(56) References Cited

U.S. PATENT DOCUMENTS

2007/0172708 A1   7/2007   Takebe et al.
2012/0038373 A1   2/2012   Ikeda et al.

FOREIGN PATENT DOCUMENTS

JP   2009-210314 A    9/2009
JP   2009210314    *   9/2009
(Continued)

OTHER PUBLICATIONS https://www.allaboutcircuits.com/tools/capacitor-impedance-calculator/ (pp. 2 and 3).*

*Primary Examiner* — Jonathan G Leong
*Assistant Examiner* — Christopher P Domone
(74) *Attorney, Agent, or Firm* — Foley & Lardner LLP

(57) ABSTRACT

A fuel cell system includes a fuel cell for generating electrical power upon being supplied with anode gas and cathode gas. The fuel cell system includes a wetness control state determination unit that determines whether or not a wetness control of controlling a degree of wetness of an electrolyte membrane of the fuel cell is normally executed, a combined capacitance calculation unit that calculates a combined capacitance of the fuel cell, and an anode gas concentration control unit that determines the occurrence of decrease in an anode gas concentration in the fuel cell or executes a control for increasing the anode gas concentration if the combined capacitance of the fuel cell is smaller than a predetermined value when the wetness control is determined to be normally executed.

9 Claims, 8 Drawing Sheets

(51) Int. Cl.
    *H01M 8/04537*     (2016.01)
    *H01M 8/04089*     (2016.01)
    *H01M 8/04992*     (2016.01)
    *H01M 8/0444*     (2016.01)
    *H01M 8/04492*     (2016.01)
    *G01R 27/02*     (2006.01)
    *G01R 31/00*     (2006.01)
    *H01M 8/1018*     (2016.01)

(52) U.S. Cl.
    CPC ... *H01M 8/04089* (2013.01); *H01M 8/04447* (2013.01); *H01M 8/04529* (2013.01); *H01M 8/04544* (2013.01); *H01M 8/04574* (2013.01); *H01M 8/04634* (2013.01); *H01M 8/04798* (2013.01); *H01M 8/04992* (2013.01); *H01M 2008/1095* (2013.01); *H01M 2250/20* (2013.01); *Y02T 90/32* (2013.01)

(56) References Cited

FOREIGN PATENT DOCUMENTS

| | | |
|---|---|---|
| JP | 2010-267472 A | 11/2010 |
| JP | 2013-080575 A | 5/2013 |
| JP | 2013-125604 A | 6/2013 |
| JP | 2013-140715 A | 7/2013 |
| JP | 2013-191362 A | 9/2013 |
| WO | WO 2010/128555 A1 | 11/2010 |

\* cited by examiner

FUEL CELL SYSTEM

TECHNICAL FIELD

The present invention relates to a fuel cell system with a fuel cell for generating electrical power upon being supplied with anode gas and cathode gas.

BACKGROUND ART

JP2009-210314A discloses a fuel cell system provided with an arrangement for calculating an electrostatic capacitance of a capacitor component of a fuel cell and diagnosing a degree of wetness (water content) of an electrolyte membrane of the fuel cell on the basis of the calculated electrostatic capacitance.

SUMMARY OF INVENTION

On the other hand, the inventors of the present application found out that a combined capacitance of an electric double layer capacitance on an anode electrode side of a fuel cell and an electric double layer capacitance on a cathode electrode side changed on the basis of not only a degree of wetness of an electrolyte membrane, but also an anode gas concentration in the fuel cell.

Thus, in the above fuel cell system not configured to address the effect of the anode gas concentration on the combined capacitance of the fuel cell, it is not possible to detect the dry-out (abnormal drying) of the electrolyte membrane of the fuel cell and a decrease of the anode gas concentration in the fuel cell in distinction.

One object of the present invention is to provide a fuel cell system capable of detecting a state of an anode gas concentration in a fuel cell in distinction from a degree of wetness of an electrolyte membrane of the fuel cell and properly responding to the state of the anode gas concentration.

According to one aspect of the present invention, a fuel cell system is provided, which has a fuel cell for generating electrical power upon being supplied with anode gas and cathode gas. The fuel cell system includes a wetness control state determination unit configured to determine whether or not a wetness control of controlling a degree of wetness of an electrolyte membrane of the fuel cell is normally executed, a combined capacitance calculation unit configured to calculate a combined capacitance of the fuel cell, and an anode gas concentration control unit configured to determine that an anode gas concentration in the fuel cell has decreased or execute a control for increasing the anode gas concentration if the combined capacitance of the fuel cell is smaller than a predetermined value when the wetness control is determined to be normally executed.

DESCRIPTION OF EMBODIMENT

Hereinafter, one embodiment of the present invention is described with reference to the drawings and the like.

In a fuel cell, an electrolyte membrane is sandwiched by an anode electrode as a fuel electrode and a cathode electrode as an oxidant electrode. The fuel cell generates electrical power using anode gas containing hydrogen and supplied to the anode electrode and cathode gas containing oxygen and supplied to the cathode electrode. Electrode reactions which proceed in both anode and cathode electrodes are as follows.

Anode electrode: $2H_2 \rightarrow 4H^+ + 4e^-$ (1)

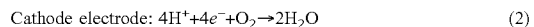

Cathode electrode: $4H^+ + 4e^- + O_2 \rightarrow 2H_2O$ (2)

The fuel cell generates an electromotive force of about 1 volt by these electrode reactions (1) and (2).

Figure 1:
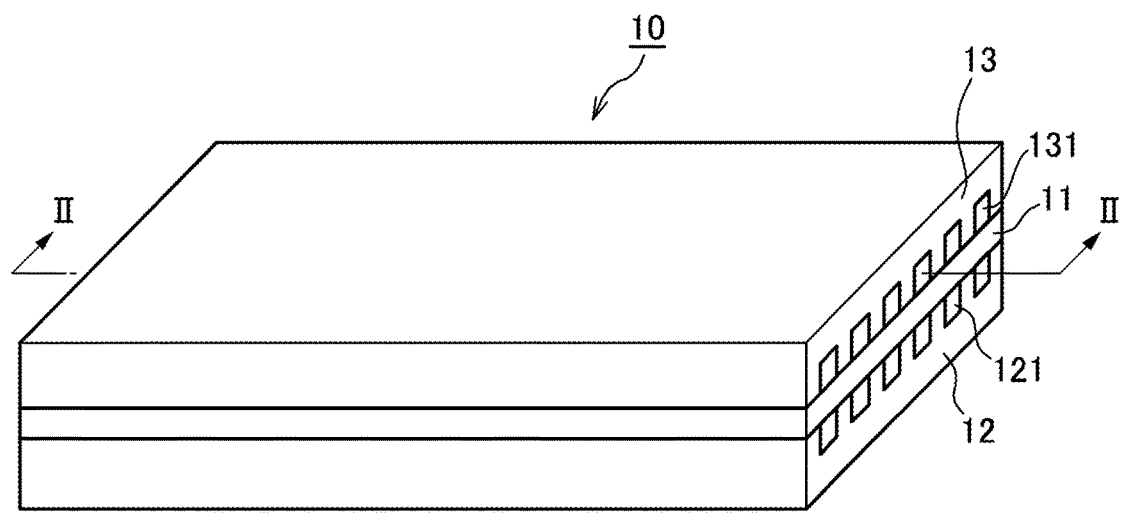
FIG. 1 is a perspective view of a fuel cell according to an embodiment of the present invention.
Figure 2:
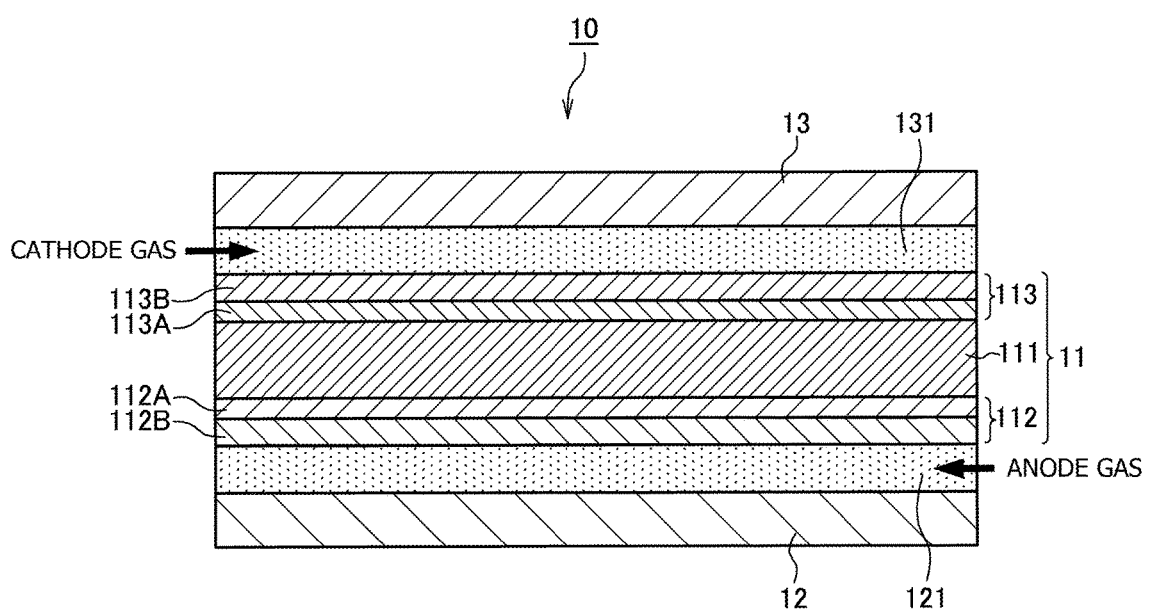
FIG. 2 is a sectional view along II-II of the fuel cell of FIG. 1.

FIGS. 1 and 2 are views showing the configuration of a fuel cell 10 according to one embodiment of the present invention. FIG. 1 is a perspective view of the fuel cell 10. FIG. 2 is a sectional view along II-II of the fuel cell 10 of FIG. 1.

As shown in FIGS. 1 and 2, the fuel cell 10 includes a membrane electrode assembly (MEA) 11, and an anode separator 12 and a cathode separator 13 arranged to sandwich the MEA 11.

The MEA 11 is composed of an electrolyte membrane 111, an anode electrode 112 and a cathode electrode 113. The MEA 11 includes the anode electrode 112 on one surface of the electrolyte membrane 111 and the cathode electrode 113 on the other surface side.

The electrolyte membrane 111 is a proton conductive ion exchange membrane formed of fluororesin. The electrolyte membrane 111 exhibits good electrical conductivity in a wet state.

The anode electrode 112 includes a catalyst layer 112A and a gas diffusion layer 112B. The catalyst layer 112A is a member formed of platinum or carbon black particles carrying platinum or the like and provided in contact with the electrolyte membrane 111. The gas diffusion layer 112B is provided on the outer side of the catalyst layer 112A. The gas diffusion layer 112B is a member formed of carbon cloth having gas diffusion property and electrical conductivity and provided in contact with the catalyst layer 112A and the anode separator 12.

Similar to the anode electrode 112, the cathode electrode 113 also includes a catalyst layer 113A and a gas diffusion layer 113B. The catalyst layer 113A is arranged between the electrolyte membrane 111 and the gas diffusion layer 113B and the gas diffusion layer 113B is arranged between the catalyst layer 113A and the cathode separator 13.

The anode separator 12 is arranged on the outer side of the gas diffusion layer 112B. The anode separator 12 includes a plurality of anode gas flow passages 121 for supplying anode gas (hydrogen gas) to the anode electrode 112. The anode gas flow passages 121 are formed as groove-like passages.

The cathode separator 13 is arranged on the outer side of the gas diffusion layer 113B. The cathode separator 13 includes a plurality of cathode gas flow passages 131 for supplying cathode gas (air) to the cathode electrode 113. The cathode gas flow passages 131 are formed as groove-like passages.

The anode separator 12 and the cathode separator 13 are so configured that the anode gas flowing in the anode gas flow passages 121 and the cathode gas flowing in the cathode gas flow passages 131 flow in directions opposite to each other. It should be noted that these gases may flow in the same direction.

In the case of using such a fuel cell 10 as a power source for an automotive vehicle, a fuel cell stack 1 in which several hundreds of fuel cells 10 are laminated is used since the required electrical power is large. Power for driving the vehicle can be taken out by configuring a fuel cell system 100 such that anode gas and cathode gas are supplied to the fuel cell stack 1.

Figure 3:
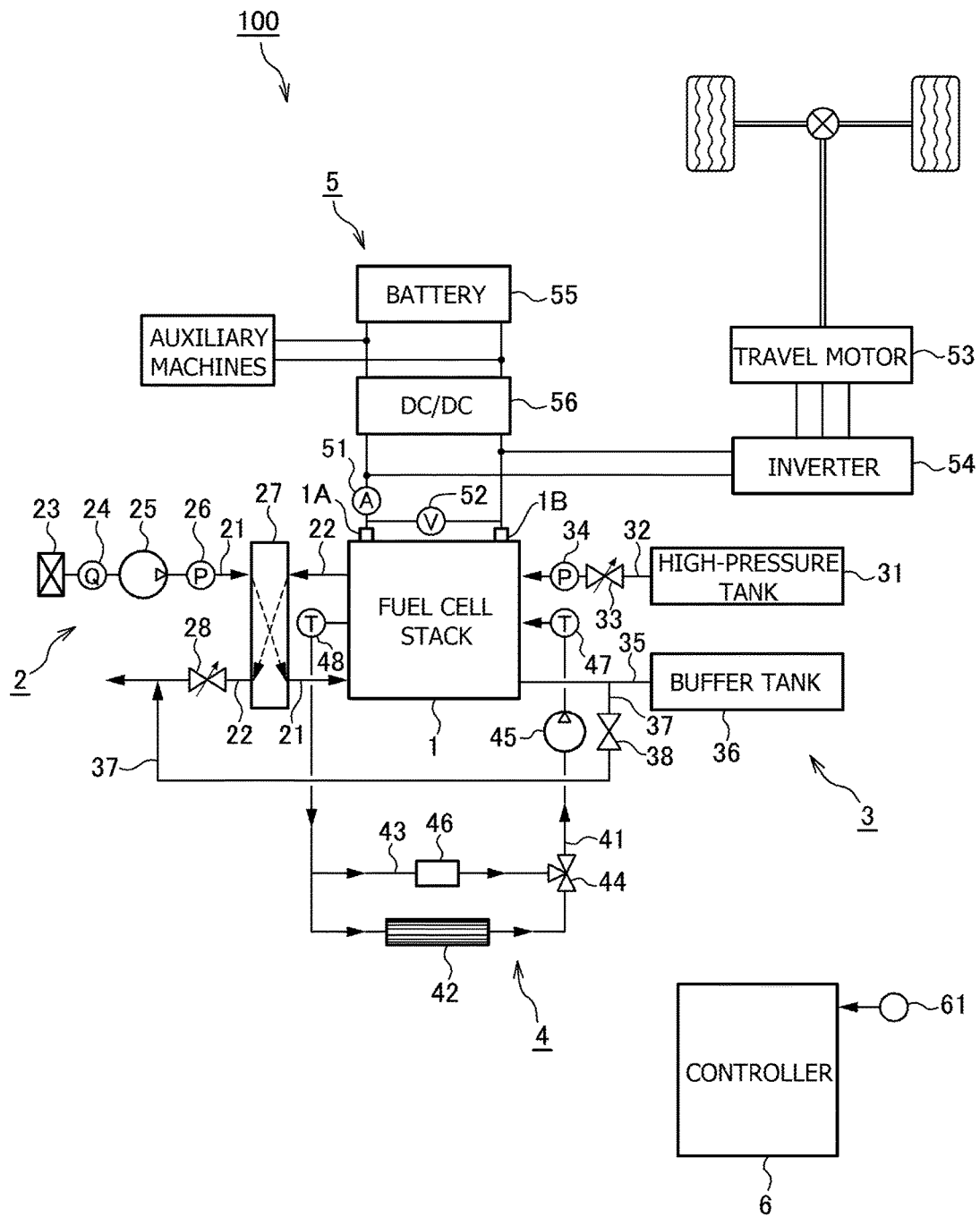
FIG. 3 is a schematic configuration diagram of a fuel cell system according to the embodiment of the present invention.

FIG. 3 is a schematic diagram of the fuel cell system 100 according to one embodiment of the present invention.

The fuel cell system 100 includes the fuel cell stack 1, a cathode gas supplying/discharging device 2, an anode gas supplying/discharging device 3, a stack cooling device 4, a power system 5 and a controller 6.

The fuel cell stack 1 is a laminated battery formed by laminating a plurality of fuel cells 10 (unit cells). The fuel cell stack 1 generates electrical power necessary to drive a vehicle upon being supplied with the anode gas and the cathode gas. The fuel cell stack 1 includes an anode electrode side terminal 1A and a cathode electrode side terminal 1B as terminals for taking out electrical power.

The cathode gas supplying/discharging device 2 supplies the cathode gas to the fuel cell stack 1 and discharges cathode off-gas discharged from the fuel cell stack 1 to outside. The cathode gas supplying/discharging device 2 includes a cathode gas supply passage 21, a cathode gas discharge passage 22, a filter 23, an air flow sensor 24, a cathode compressor 25, a cathode pressure sensor 26, a water recovery device (WRD) 27 and a cathode pressure regulating valve 28.

The cathode gas supply passage 21 is a passage in which the cathode gas to be supplied to the fuel cell stack 1 flows. One end of the cathode gas supply passage 21 is connected to the filter 23 and the other end is connected to a cathode gas inlet part of the fuel cell stack 1.

The cathode gas discharge passage 22 is a passage in which the cathode off-gas discharged from the fuel cell stack 1 flows. One end of the cathode gas discharge passage 22 is connected to a cathode gas outlet part of the fuel cell stack 1 and the other end is formed as an opening end. The cathode off-gas is a mixture of gas containing the cathode gas, steam produced by the electrode reaction and the like.

The filter 23 is a member for removing dust, dirt and the like contained in the cathode gas to be taken into the cathode gas supply passage 21.

The cathode compressor 25 is provided downstream of the filter 23 in the cathode gas supply passage 21. The cathode compressor 25 supplies the cathode gas in the cathode gas supply passage 21 to the fuel cell stack 1 by feeding it under pressure.

The air flow sensor 24 is provided between the filter 23 and the cathode compressor 25 in the cathode gas supply passage 21. The air flow sensor 24 detects a flow rate of the cathode gas to be supplied to the fuel cell stack 1.

The cathode pressure sensor 26 is provided between the cathode compressor 25 and the WRD 27 in the cathode gas supply passage 21. The cathode pressure sensor 26 detects a pressure of the cathode gas to be supplied to the fuel cell stack 1. The cathode gas pressure detected by the cathode pressure sensor 26 represents a pressure of an entire cathode system including the cathode gas flow passages of the fuel cell stack 1 and the like.

The WRD 27 is connected across the cathode gas supply passage 21 and the cathode gas discharge passage 22. The WRD 27 recovers moisture in the cathode off-gas flowing in the cathode gas discharge passage 22 and humidifies the cathode gas flowing in the cathode gas supply passage 21 with that recovered moisture.

The cathode pressure regulating valve 28 is provided downstream of the WRD 27 in the cathode gas discharge passage 22. The cathode pressure regulating valve 28 is controlled to open and close by the controller 6 and adjusts the pressure of the cathode gas to be supplied to the fuel cell stack 1.

Next, the anode gas supplying/discharging device 3 is described. The anode gas supplying/discharging device 3 supplies the anode gas to the fuel cell stack 1 and discharges anode off-gas discharged from the fuel cell stack 1 to the cathode gas discharge passage 22. The anode gas supplying/ discharging device 3 includes a high-pressure tank 31, an anode gas supply passage 32, an anode pressure regulating valve 33, an anode pressure sensor 34, an anode gas discharge passage 35, a buffer tank 36, a purge passage 37 and a purge valve 38.

The high-pressure tank 31 stores the anode gas to be supplied to the fuel cell stack 1 in a high-pressure state.

The anode gas supply passage 32 is a passage for supplying the anode gas discharged from the high-pressure tank 31 to the fuel cell stack 1. One end of the anode gas supply passage 32 is connected to the high-pressure tank 31 and the other end is connected to an anode gas inlet part of the fuel cell stack 1.

The anode pressure regulating valve 33 is provided downstream of the high-pressure tank 31 in the anode gas supply passage 32. The anode pressure regulating valve 33 is controlled to open and close by the controller 6 and adjusts a pressure of the anode gas to be supplied to the fuel cell stack 1.

The anode pressure sensor 34 is provided downstream of the anode pressure regulating valve 33 in the anode gas supply passage 32. The anode pressure sensor 34 detects a pressure of the anode gas to be supplied to the fuel cell stack 1. The anode gas pressure detected by the anode pressure sensor 34 represents a pressure of an entire anode system including the buffer tank 36, the anode gas flow passages of the fuel cell stack 1 and the like.

The anode gas discharge passage 35 is a passage in which the anode off-gas discharged from the fuel cell stack 1 flows. One end of the anode gas discharge passage 35 is connected to an anode gas outlet part of the fuel cell stack 1 and the other end is connected to the buffer tank 36. The anode gas contains the anode gas not used in the electrode reaction, impurity gas such as nitrogen having leaked from the cathode gas flow passages 131 to the anode gas flow passages 121, moisture and the like.

The buffer tank 36 is a container for temporarily storing the anode off-gas flowing from the anode gas discharge passage 35. The anode off-gas pooled in the buffer tank 36 is discharged to the cathode gas discharge passage 22 through the purge passage 37 when the purge valve 38 is opened.

The purge passage 37 is a passage for discharging the anode off-gas. One end of the purge passage 37 is connected to a part of the anode gas discharge passage 35 upstream of the buffer tank 36 and the other end is connected to a part of the cathode gas discharge passage 22 downstream of the cathode pressure regulating valve 28.

The purge valve 38 is provided in the purge passage 37. The purge valve 38 is controlled to open and close by the controller 6 and controls a purge flow rate of the anode off-gas discharged from the anode gas discharge passage 35 to the cathode gas discharge passage 22.

When a purge control is executed to open the purge valve 38, the anode off-gas is discharged to the outside through the purge passage 37 and the cathode gas discharge passage 22. At this time, the anode off-gas is mixed with the cathode off-gas in the cathode gas discharge passage 22. By mixing the anode off-gas and the cathode off-gas and discharging them to the outside in this way, an anode gas concentration (hydrogen concentration) in the mixture of gas is set at a value not larger than a discharge allowable concentration.

The stack cooling device 4 is a temperature regulating device for cooling the fuel cell stack 1 by cooling water such as antifreeze and regulating the fuel cell stack 1 to a temperature suitable for power generation. The stack cooling device 4 includes a circulation passage 41, a radiator 42, a bypass passage 43, a three-way valve 44, a circulation pump 45, a PTC heater 46, an inlet water temperature sensor 47 and an outlet water temperature sensor 48.

The circulation passage 41 is configured as a looped passage in which the cooling water is circulated. One end of the circulation passage 41 is connected to a cooling water inlet part of the fuel cell stack 1 and the other end is connected to a cooling water outlet part of the fuel cell stack 1.

The radiator 42 is provided in the circulation passage 41. The radiator 42 is a heat exchanger for radiating the heat of the cooling water discharged from the fuel cell stack 1 to outside.

The bypass passage 43 is a passage in which the cooling water flows while bypassing the radiator 42. One end of the bypass passage 43 is connected to a part of the circulation passage 41 upstream of the radiator 42 and the other end is connected to the three-way valve 44 provided downstream of the radiator 42 in the circulation passage 41.

The three-way valve 44 switches a circulation route of the cooling water according to the temperature of the cooling water. Specifically, if the temperature of the cooling water is higher than a predetermined temperature, the three-way valve 44 is switched so that the cooling water discharged from the fuel cell stack 1 is supplied to the fuel cell stack 1 again through the radiator 42. In contrast, if the temperature of the cooling water is lower than a predetermined temperature, the three-way valve 44 is switched so that the cooling water discharged from the fuel cell stack 1 is supplied to the fuel cell stack 1 again after flowing along the bypass passage 43.

The circulation pump 45 is provided downstream of the three-way valve 44 in the circulation passage 41 and circulates the cooling water.

The PTC heater 46 is provided in the bypass passage 43. The PTC heater 46 is energized during the warm-up of the fuel cell stack 1 to increase the temperature of the cooling water.

The inlet water temperature sensor 47 is provided near the cooling water inlet part of the fuel cell stack 1 in the circulation passage 41. The outlet water temperature sensor 48 is provided near the cooling water outlet part of the fuel cell stack 1 in the circulation passage 41. The inlet water temperature sensor 47 detects the temperature of the cooling water flowing into the fuel cell stack 1 and the outlet water temperature sensor 48 detects the temperature of the cooling water discharged from the fuel cell stack 1. An average water temperature calculated from the inlet water temperature detected by the inlet water temperature sensor 47 and the outlet water temperature detected by the outlet water temperature 48 is used as an internal temperature of the fuel cell stack 1, i.e. a so-called stack temperature.

The power system 5 includes a current sensor 51, a voltage sensor 52, a traction motor 53, an inverter 54, a battery 55 and a DC/DC converter 56.

The current sensor 51 detects an output current extracted from the fuel cell stack 1. The voltage sensor 52 detects an output voltage of the fuel cell stack 1, i.e. an inter-terminal voltage between the anode electrode side terminal 1A and the cathode electrode side terminal 1B. The voltage sensor 52 may be configured to detect a voltage of each fuel cell 10 or may be configured to detect a voltage of each group composed of a plurality of the fuel cells 10.

The traction motor 53 is a three-phase alternating-current synchronous motor and forms a drive source for driving wheels. The traction motor 53 has a function as a motor to rotate upon being supplied with electrical power from the fuel cell stack 1 and the battery 55, and also has a function as a generator for generating electrical power by being rotationally driven by an external force.

The inverter 54 is composed of a plurality of semiconductor switches such as IGBTs. The semiconductor switches of the inverter 54 are switching-controlled by the controller 6, thereby converting direct-current power into alternating-current power or alternating-current power into direct-current power. The inverter 54 converts composite direct-current power of output power of the fuel cell stack 1 and output power of the battery 55 into three-phase alternating-current power and supplies it to the traction motor 53 when the traction motor 53 functions as the motor. In contrast, the inverter 54 converts regenerative power (three-phase alternating-current power) of the traction motor 53 into direct-current power and supplies it to the battery 55 when the traction motor 53 functions as the generator.

The battery 55 is configured to be charged with a surplus of the output power of the fuel cell stack 1 and the regenerative power of the travel motor 53. The electrical power charged into the battery 55 is supplied to auxiliary machines such as the cathode compressor 25 and the traction motor 53 if necessary.

The DC/DC converter 56 is a bidirectional voltage converter for increasing and decreasing the output voltage of the fuel cell stack 1. By controlling the output voltage of the fuel cell stack 1 by the DC/DC converter 56, the output current of the fuel cell stack 1 and the like are adjusted.

The controller 6 is configured by a microcomputer including a central processing unit (CPU), a read-only memory (ROM), a random access memory (RAM) and an input/output interface (I/O interface). Controller 6 inputs signals from sensors for detecting a state of the fuel cell system 100 such as an accelerator stroke sensor 61 for detecting a depressed amount of an accelerator pedal, as well as signals from various sensors such as the air flow sensor 24.

The controller 6 adjusts the pressures and flow rates of the anode gas and the cathode gas to be supplied to the fuel cell stack 1 by controlling the anode pressure regulating valve 33, the cathode pressure regulating valve 28, the cathode compressor 25 and the like according to the operating state of the fuel cell system 100.

Furthermore, the controller 6 calculates target output power of the fuel cell stack 1 on the basis of the operating state of the fuel cell system 100. The controller 6 calculates the target output power on the basis of electrical power required by the traction motor 53, electrical power required by the auxiliary machines such as the cathode compressor 25, charge/discharge requests of the battery 55 and the like. The controller 6 calculates a target output current of the fuel cell stack 1 on the basis of the target output power by referring to an IV characteristic (current-voltage characteristic) of the fuel cell stack 1 determined in advance. Then, the controller 6 controls the output voltage of the fuel cell stack 1 by the DC/DC converter 56 such that the output current of the fuel cell stack 1 reaches the target output current, and supplies a necessary current to the traction motor 53 and the auxiliary machines.

Furthermore, the controller 6 controls the cathode compressor 25, the circulation pump 45 and the like such that the electrolyte membranes 111 of fuel cell 10 have a degree of wetness (water content) suitable for power generation. The controller 6 calculates an internal impedance HFR of the fuel cell stack 1 correlated with the degree of wetness of the electrode membranes 111 and controls the cathode compressor 25, the circulation pump 45 and the like such that a wetness degree determining internal impedance HFR reaches a target HFR. In the present embodiment, the target HFR is set at a predetermined value suitable for power generation determined in advance by an experiment or the like. The target HFR may be appropriately set according to the state of the fuel cell system 100.

The wetness degree determining internal impedance HFR is calculated, for example, on the basis of an alternating-current impedance method. In the case of using the alternating-current impedance method, the controller 6 controls an output of the fuel cell stack 1 such that the output current and the output voltage of the fuel cell stack 1 include alternating-current signals with a wetness degree determining frequency (e.g. 1 kHz) and calculates the wetness degree determining internal impedance HFR on the basis of an output current value and an output voltage value detected at this time. An example of the calculation of the wetness degree determining internal impedance HFR is described later with reference to FIG. 6. It should be noted that the wetness degree determining internal impedance HFR can also be calculated by a technique other than the alternating-current impedance method such as an alternating-current bridge method.

In the fuel cell system 100, it is important to maintain an anode gas concentration (hydrogen concentration) in the fuel cell stack 1 at a concentration capable of efficient and stable power generation and it has to be avoided that the anode gas concentration becomes such a concentration to reduce power generation efficiency. Concerning the anode gas concentration in the fuel cell stack 1, the present inventors found out a correlation between the anode gas concentration in the fuel cell stack 1 and a combined capacitance of the fuel cell stack 1. The combined capacitance of the fuel cell stack 1 is a combined capacitance of electric double layer capacities of the anode electrode 112 and the cathode electrode 113 of each fuel cell 10. The fuel cell system 100 according to the present embodiment is configured to detect a state of the anode gas concentration in the fuel cell stack 1 on the basis of the combined capacitance of the fuel cell stack 1.

In the fuel cell system 100, the combined capacitance of the fuel cell stack 1 is calculated on the basis of a combined capacitance determining internal impedance obtained by the alternating-current impedance method. For example, the controller 6 controls an output of the fuel cell stack 1 such that an output current and an output voltage of the fuel cell stack 1 include alternating-current signals with a combined capacitance determining frequency (e.g. several to several hundreds of Hz) lower than the wetness degree determining frequency. Then, the controller 6 calculates the combined capacitance determining internal impedance on the basis of an output current value and an output voltage value and calculates the combined capacitance of the fuel cell stack 1 on the basis of an imaginary-part component Zim of the combined capacitance determining internal impedance. An example of the calculation of the combined capacitance is described later with reference to FIG. 8.

Figure 4:
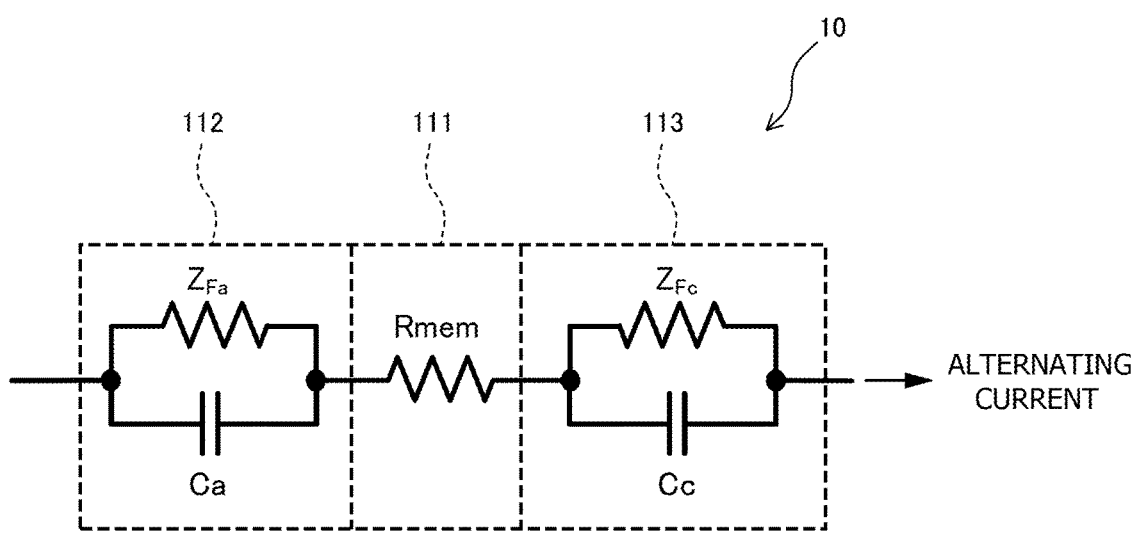
FIG. 4 is a diagram showing an equivalent circuit of the fuel cell.

Next, a detection principle of the anode gas concentration state based on the combined capacitance of the fuel cell 10 is described with reference to FIG. 4. FIG. 4 is a diagram showing an equivalent circuit of the fuel cell 10.

As shown in FIG. 4, the equivalent circuit of the fuel cell 10 constituting the fuel cell stack 1 is represented by a membrane resistance Rmem of the electrolyte membrane 111, a Faraday's impedance $Z_{Fa}$ (resistance component) and an electric double layer capacitance Ca (capacitor component) of the anode electrode 112, and a Faraday's impedance $Z_{Fc}$ (resistance component) and an electric double layer capacitance Cc (capacitor component) of the cathode electrode 113.

Here, by superimposing, for example, an alternating-current with the combined capacitance determining frequency (alternating-current signal) on such an equivalent circuit, the combined capacitance of the electric double layer capacitances Ca, Cc of the anode electrode 112 and the cathode electrode 113 of the fuel cell 10 can be calculated utilizing the alternating-current impedance method.

If impurity gas and the like are hardly contained in the anode gas and the anode gas concentration in the fuel cell 10 is not reduced, a sufficient amount of the anode gas is present around the anode electrode 112. Since the anode gas has high reactivity in the anode electrode 112, the Faraday's impedance $Z_{Fa}$ of the anode electrode 112 is very small and an alternating current during the detection of the combined capacitance hardly flows into the electric double layer capacitance Ca of the anode electrode 112 if sufficient anode gas is present in the fuel cell 10. Thus, the combined capacitance of the fuel cell 10 is a value composed only of the electric double layer capacitance Cc of the cathode electrode 113 without including the electric double layer capacitance Ca of the anode electrode 112.

On the other hand, if impurity gas and the like in the anode gas increases and the anode gas concentration decreases, the amount of the anode gas around the anode electrode 112 decreases. Since the reactivity of the anode gas in the anode electrode 112 decreases in such a case, the Faraday's impedance $Z_{Fa}$ of the anode electrode 112 increases. Then, the alternating current during the detection of the combined capacitance flows not only into the Faraday's impedance $Z_{Fa}$, but also into the electric double layer capacitance Ca of the anode electrode 112. As a result, the combined capacitance C of the fuel cell 10 is a value obtained by combining the electric double layer capacitance Ca of the anode electrode 112 and the electric double layer capacitance Cc of the cathode electrode 113.

$$C = \frac{C_a C_c}{C_a + C_c} \quad (1)$$

If the anode gas concentration decreases, the effect of the electric double layer capacitance Ca of the anode electrode 112 increases, and an apparent value of the electric double layer capacitance Ca increases. Thus, the combined capacitance C of the fuel cell 10 calculated by equation (1) decreases as the anode gas concentration becomes smaller. That is, the combined capacitance C of the fuel cell 10 changes according to the anode gas concentration and decreases as the anode gas concentration decreases. In the present embodiment, the fuel cell system 100 is configured to detect the state of the anode gas concentration on the basis of the combined capacitance of the fuel cell stack 1, utilizing such a property of the combined capacitance.

Here, a case where a cathode gas concentration is reduced and the amount of the cathode gas around the cathode electrode 113 is reduced is thought. Since the reactivity of the cathode gas in the cathode electrode 113 is low, the Faraday's impedance $Z_{Fc}$ of the cathode electrode 113 is large and the electric double layer capacitance Cc of the cathode electrode 113 cannot be ignored during the detection of the combined capacitance. Thus, the electric double layer capacitance Cc of the cathode electrode 113 does not largely change even if the cathode gas concentration decreases and the Faraday's impedance $Z_{Fc}$ of the cathode electrode 113 increases. Thus, in the fuel cell system 100 according to the present embodiment, the state of the anode gas concentration can be accurately detected on the basis of the combined capacitance of the fuel cells 10 even in such a situation where the cathode gas concentration decreases.

Figure 5:
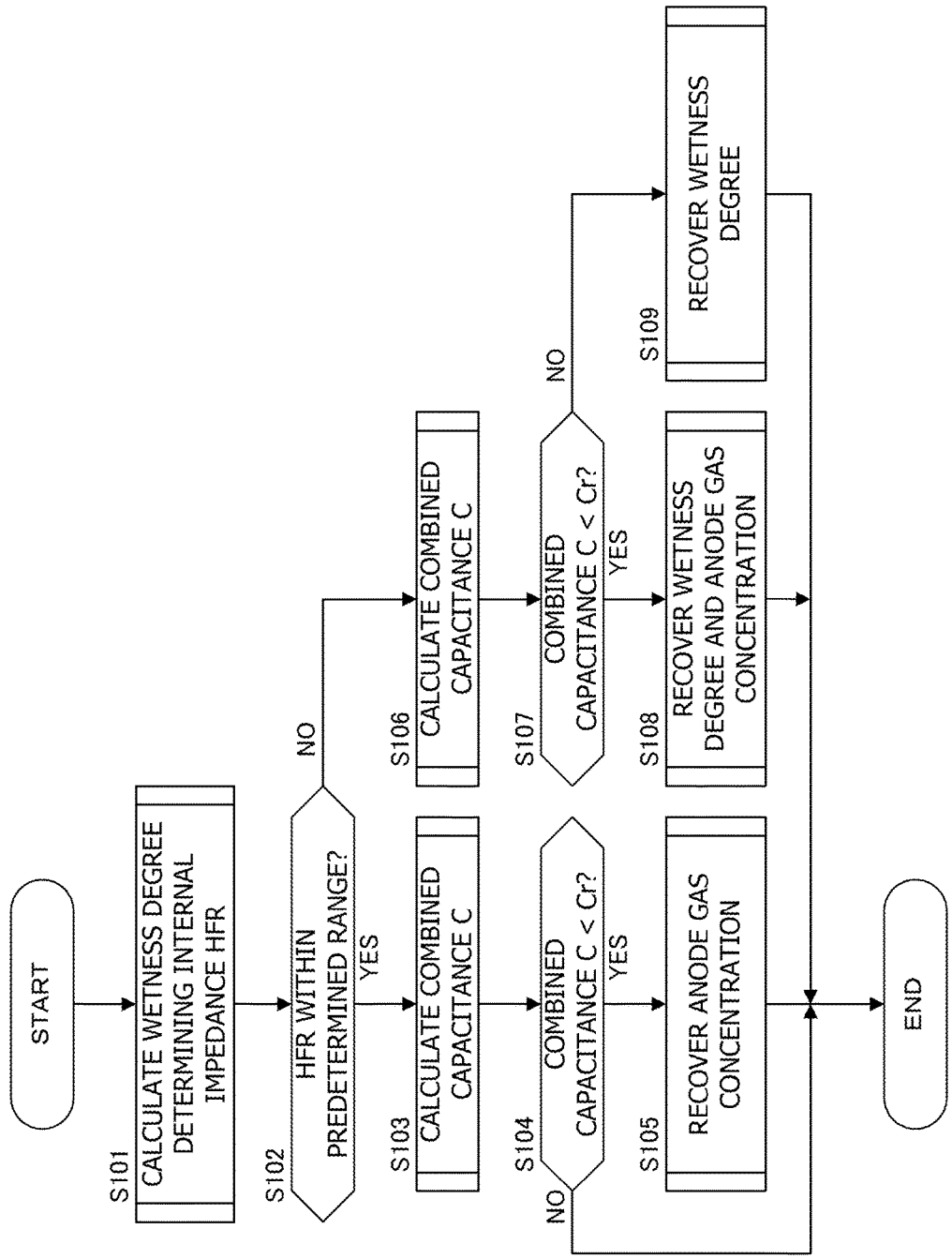
FIG. 5 is a flow chart of a management control executed by a controller of the fuel cell system.

Next, a management control of the degree of wetness of the fuel cell stack 1 and the anode gas concentration of the fuel cell stack 1 is described with reference to FIG. 5. FIG. 5 is a flow chart showing the management control executed by the controller 6 of the fuel cell system 100. This management control is repeatedly executed in a predetermined computation cycle from the start-up to the end of the fuel cell system 100.

In Step 101 (S101), the controller 6 performs a process of calculating the wetness degree determining internal impedance HFR. The wetness degree determining internal impedance HFR is an index correlated with the degree of wetness of the electrolyte membrane 111 of the fuel cell 10. The wetness degree determining internal impedance HFR is a value which increases as the degree of wetness of the electrolyte membrane 111 decreases, i.e. the electrolyte membrane 111 becomes drier. It should be noted that the detail of the wetness degree determining internal impedance HFR calculation process is described later with reference to FIG. 6.

In S102, the controller 6 determines whether or not the wetness degree determining internal impedance HFR calculated in S101 is a value within a predetermined range. The predetermined range is set at a range where the degree of wetness of the electrolyte membranes 111 is a degree of wetness suitable for power generation.

If the wetness degree determining internal impedance HFR is a value within the predetermined range, the controller 6 determines that a wetness control (wetness degree control) is normally executed and performs a processing of S103. On the other hand, if the wetness degree determining internal impedance HFR is smaller than a lower limit value of the predetermined range, it is determined that the wetness control is failed to be normally executed and the electrolyte membranes 111 are in an excessively dry state. If the wetness degree determining internal impedance HFR is larger than an upper limit value of the predetermined range, it is determined that the wetness control is failed and the electrolyte membranes 111 are in an excessively wet state. If the wetness control is determined to be failed in this way, the controller 6 performs processes in S106 and subsequent steps.

If the wetness control is determined to be normally executed in S102, the controller 6 performs a process of calculating the combined capacitance C of the fuel cell stack 1 in S103. The combined capacitance C of the fuel cell stack 1 is an index correlated with the anode gas concentration in the fuel cell stack 1, a value of which becomes smaller as the anode gas concentration decreases. It should be noted that the detail of the combined capacitance C calculation process is described later with reference to FIGS. 7 and 8.

In S104, the controller 6 determines whether or not the combined capacitance C calculated in S103 is smaller than a determination value Cr. The determination value Cr is set at a value capable of determining whether or not the anode gas concentration in the fuel cell stack 1 is a concentration necessary for power generation.

If the calculated combined capacitance C is equal to or larger than the determination value Cr, the controller 6 determines that the anode gas concentration in the fuel cell stack 1 is normal and the amount of the anode gas necessary for power generation has been supplied to the fuel cell system 1, and finishes this management control. On the other hand, if the calculated combined capacitance C is smaller than the determination value Cr, the controller 6 determines that the anode gas concentration in the fuel cell stack 1 is low and the amount of the anode gas is insufficient, and performs a process of S105.

In S105, the controller 6 executes a control of recovering (increasing) the anode gas concentration in the fuel cell stack 1. After the process of S105, the controller 6 finishes this management control.

In the anode gas concentration recovery control, the controller 6 controls the anode pressure regulating valve 33 to increase the anode pressure or controls the purge valve 38 to discharge the anode off-gas. It should be noted that, if the fuel cell system 100 is configured such that the anode off-gas discharged to the anode gas discharge passage 35 is recirculated to the anode gas supply passage 32 by an unillustrated reflux pump, the anode gas concentration may be recovered by controlling the reflux pump such that a flow rate of the recirculated anode off-gas increases.

As described above, the controller 6 determines that the anode gas concentration has decreased and executes the anode gas concentration recovery control if the combined capacitance C is smaller than the determination value Cr. However, the controller 6 may be configured to execute only the anode gas concentration recovery control without determining a decrease of the anode gas concentration if the combined capacitance C is smaller than the determination value Cr. Furthermore, the controller 6 may be configured to determine a decrease of the anode gas concentration and notify a low anode gas concentration state to a driver or the like if the combined capacitance C is smaller than the determination value Cr.

If the wetness control is determined not to be normally executed in S102, the controller 6 performs the combined capacitance C calculation process of S106 and, then, determines in S107 whether or not the combined capacitance C is smaller than the determination value Cr. The process of S106 is a process similar to that of S103 and the process of S107 is a process similar to that of S104.

If the combined capacitance C is determined to be smaller than the determination value Cr in S107, the controller 6 performs a process of S108. In S108, the controller 6 executes a wetness degree recovery control and the anode gas concentration recovery control. After the process of S108, the controller 6 finishes this management control.

If there is an abnormality in the wetness control, particularly if the electrolyte membranes 111 are excessively dry, it is known that the combined capacitance of the fuel cell stack 1 decreases due to a decrease of the degree of wetness. Thus, in a state where there is some sort of abnormality in the wetness control and the electrolyte membranes 111 are excessively dry, it is not possible to discriminate whether the degrease of the combined capacitance of the fuel cell stack 1 is due to the decrease of the degree of wetness or the decrease of the anode gas concentration. As a result, it may not be possible to detect the decrease of the anode gas concentration on the basis of the combined capacitance of the fuel cell stack 1. Accordingly, if the combined capacitance C of the fuel cell stack 1 becomes smaller than the determination value Cr when there is an abnormality in the wetness control, the controller 6 not only executes a control of recovering the degree of wetness of the electrolyte membranes 111, but also simultaneously executes a control of recovering (increasing) the anode gas concentration in the fuel cell stack 1.

If the electrolyte membranes 111 are in an excessively dry state, the controller 6 controls the cathode compressor 25 to decrease the cathode gas flow rate or controls the circulation pump 45 to lower the stack temperature in order to increase the degree of wetness. On the other hand, if the electrolyte membranes 111 are in an excessively wet state, the controller 6 controls the cathode compressor 25 to increase the cathode gas flow rate or controls the circulation pump 45 to increase the stack temperature in order to decrease the degree of wetness. It should be noted that the anode gas concentration recovery control in S108 is similar to that in S105.

On the other hand, if the combined capacitance C is determined to be equal to or more than the determination value Cr in S107, the controller 6 judges that at least the decrease of the anode gas concentration is absent, and performs a process of S109. The controller 6 finishes this management control after executing only the wetness degree recovery control in Step S109. It should be noted that the wetness degree recovery control in S109 is similar to that of S108.

Figure 6:
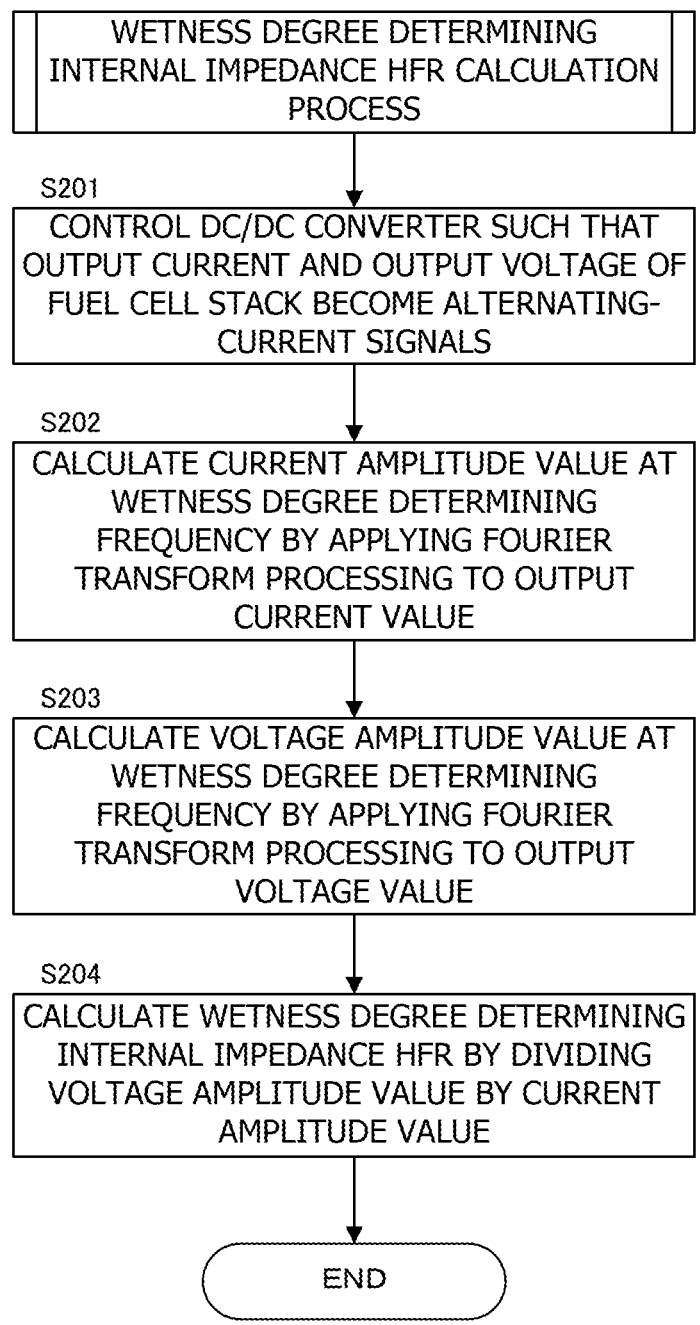
FIG. 6 is a flow chart showing a wetness degree determining internal impedance HFR calculation process performed by the controller.

The calculation process of the wetness degree determining internal impedance HFR of the fuel cell stack 1 performed in 101 of FIG. 5 is described with reference to FIG. 6. The calculation process of the wetness degree determining internal impedance HFR is based on the alternating-current impedance method.

In S201, the controller 6 controls the DC/DC converter 56 such that an output current and an output voltage output from the fuel cell stack 1 include alternating-current signals with the wetness degree determining frequency (e.g. 1 kHz).

In S202, the controller 6 calculates a current amplitude value at the wetness degree determining frequency by applying a known Fourier transform processing to an output current value (alternating-current value) detected by the current sensor 51.

In S203, the controller 6 calculates a voltage amplitude value at the wetness degree determining frequency by applying a known Fourier transform processing to an output voltage value (alternating-voltage value) detected by the voltage sensor 52.

In S204, the controller 6 calculates the wetness degree determining internal impedance HFR correlated with the degree of wetness of the electrolyte membranes 111 by dividing the voltage amplitude value calculated in S203 by the current amplitude value calculated in S202. After a processing of S204, the controller 6 finishes the wetness degree determining internal impedance HFR calculation process.

The wetness degree determining internal impedance HFR calculated in S204 is used to judge a state of the wetness control in S102 of the management control of FIG. 5.

Figure 7:
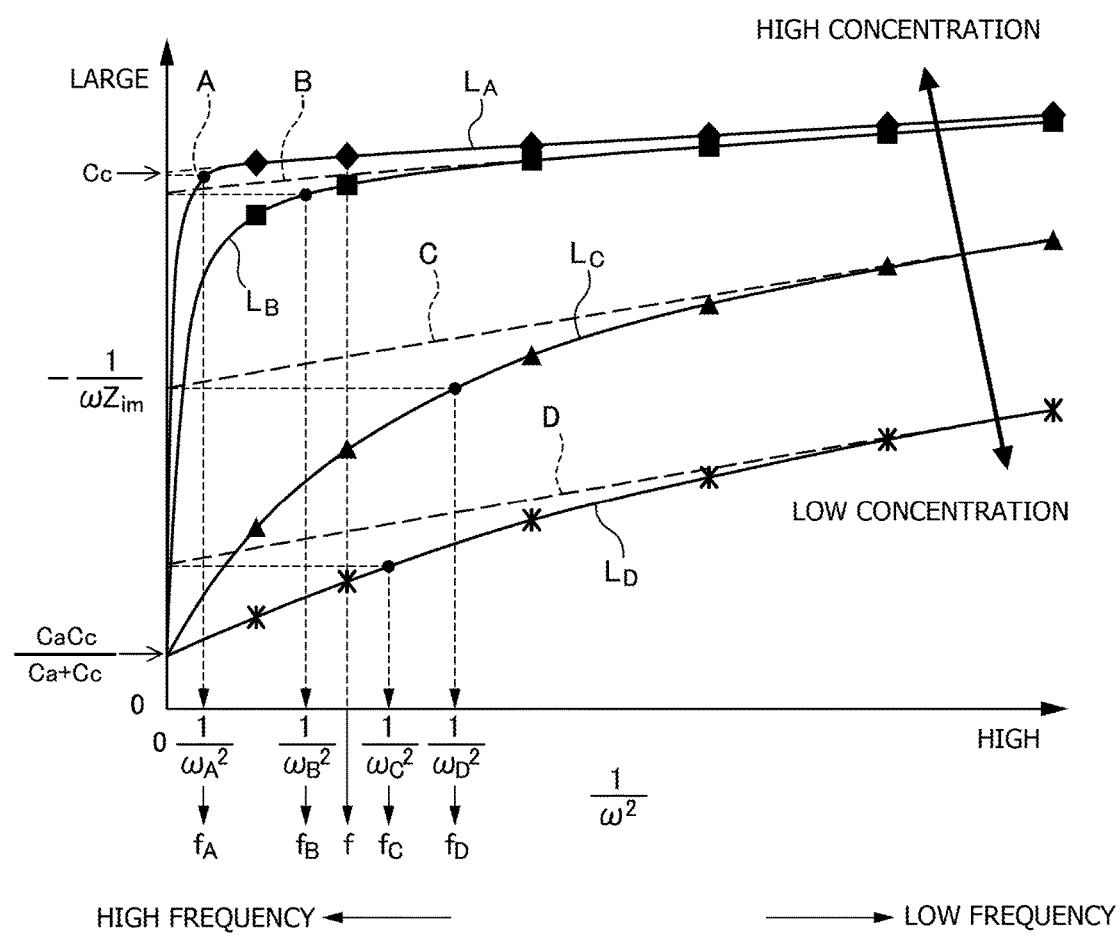
FIG. 7 is a graph showing a calculation principle of a combined capacitance of a fuel cell stack.
Figure 8:
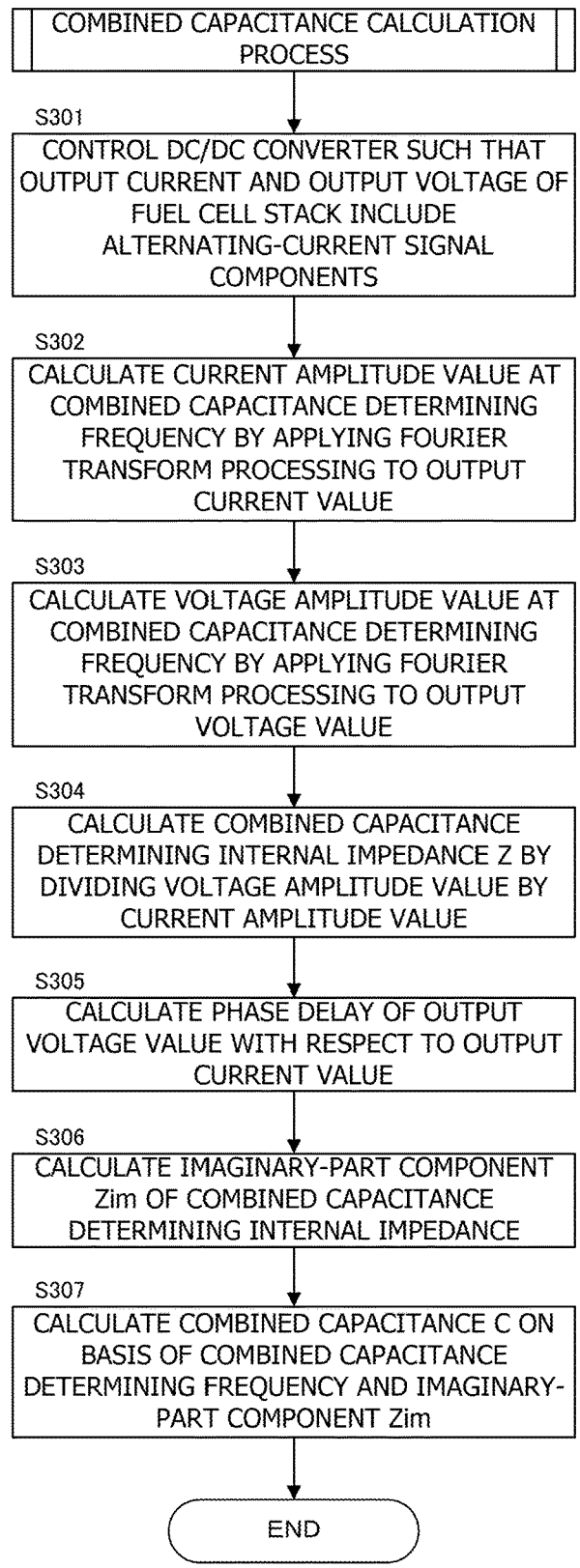
FIG. 8 is a flow chart showing a combined capacitance C calculation process performed by the controller.

Next, the calculation of the combined capacitance C of the fuel cell stack 1 is described with reference to FIGS. 7 and 8. FIG. 7 is a graph showing a calculation principle of the combined capacitance C of the fuel cell stack 1, and FIG. 8 is a flow chart showing the combined capacitance C calculation process performed in S103 and S106 of FIG. 5.

The calculation of the combined capacitance C of the fuel cell stack 1 is performed, utilizing the alternating-current impedance method. As shown in FIG. 4, the equivalent circuit of the fuel cell 10 constituting the fuel cell stack 1 is represented by the membrane resistance Rmem of the electrolyte membrane 111, the Faraday's impedance $Z_{Fa}$ and the electric double layer capacitance Ca of the anode electrode 112, and the Faraday's impedance $Z_{Fc}$ and the electric double layer capacitance Cc of the cathode electrode 113. In such an equivalent circuit, an internal impedance Z (combined impedance) of the fuel cell 10 is expressed as in equation (2).

$$Z = R_{mem} + \frac{Z_{Fa}(1 - j\omega C_a Z_{Fa})}{1 + \omega^2 C_a^2 Z_{Fa}^2} + \frac{Z_{Fc}(1 - j\omega C_c Z_{Fc})}{1 + \omega^2 C_c^2 Z_{Fc}^2} \quad (2)$$

$$\omega = 2\pi f$$

f: frequency of alternating-current signal

If the imaginary-part component Zim of the internal impedance Z is extracted, equation (3) can be transformed into equation (3).

$$Z_{im} = -\frac{\omega C_a Z_{Fa}^2}{1 + \omega^2 C_a^2 Z_{Fa}^2} - \frac{\omega C_c Z_{Fc}^2}{1 + \omega^2 C_c^2 Z_{Fc}^2} \quad (3)$$

If equation (3) is further transformed, equation (4) is obtained.

$$-\frac{1}{\omega Z_{im}} = \frac{1}{C_a Z_{Fa}^2(1 + \omega^2 C_c^2 Z_{Fc}^2) + C_c Z_{Fc}^2(1 + \omega^2 C_a^2 Z_{Fa}^2)} \times \frac{1}{\omega^2} + \quad (4)$$

$$\frac{\frac{C_a^2 Z_{Fa}^2}{\omega^2 C_a C_c Z_{Fa}^2 Z_{Fc}^2} + \frac{C_c^2 Z_{Fc}^2}{\omega^2 C_a C_c Z_{Fa}^2 Z_{Fc}^2} + C_a C_c}{\frac{C_a Z_{Fa}^2}{\omega^2 C_a C_c Z_{Fa}^2 Z_{Fc}^2} + \frac{C_c Z_{Fc}^2}{\omega^2 C_a C_c Z_{Fa}^2 Z_{Fc}^2} + C_a + C_c}$$

If equation (4) is organized with $\omega = \infty$, equation (5) is obtained.

$$\lim_{w \to +\infty}\left(-\frac{1}{\omega Z_{im}}\right) = \frac{C_a C_c}{C_a + C_c} \quad (5)$$

The right side of this equation (5) indicates a series combined capacitance of the electric double layer capacitances of the anode electrode 112 and the cathode electrode 113 constituting the fuel cell stack 1. Furthermore, if an abscissa represents $1/\omega^2$ and an oridinate represents $-1/(\omega \cdot Zim)$, equation (4) is represented by solid lines (characteristic graphs) of FIG. 7. As shown in FIG. 7, the characteristic graphs show different tendencies according to the anode gas concentration (hydrogen concentration) in the anode electrode, and intercepts of these solid lines indicate series combined capacitances ($C_a C_c/(C_a+C_c)$) of the electric double layer capacitances of the anode electrode 112 and the cathode electrode 113.

Here, if the anode gas concentration on the side of the anode electrode is sufficiently high and the frequency of the alternating current to be superimposed on the fuel cell stack 1 is sufficiently low, an equivalent circuit modeling the fuel cell stack 1 is a circuit obtained by omitting the anode electrode 112 from the equivalent circuit shown in FIG. 4.

In such an equivalent circuit, equation (6) is obtained as an equation relating to the imaginary-part component Zim of the internal impedance Z.

$$-\frac{1}{\omega Z_{im}} = \frac{1}{C_c Z_{Fc}^2} \times \frac{1}{\omega^2} + C_c \quad (6)$$

Equation (6) indicates a straight line with a gradient of $1/(C_c \cdot Z_{Fc}^2)$ and an intercept of $C_c$ if the abscissa of a coordinate system (horizontal axis) represents $1/\omega^2$ and the ordinate (vertical axis) represents $-1/(\omega \cdot Zim)$. The intercept of this equation (6) indicates the combined capacitance C. If the anode gas concentration on the side of the anode electrode is sufficiently high and the frequency of the alternating current to be superimposed on the fuel cell stack 1 is sufficiently low, the electric double layer capacitance Ca of the anode electrode 112 is not reflected on the combined capacitance C and the electric double layer capacitance Cc of the cathode electrode 113 is the combined capacitance C. That is, it means that, in terms of a characteristic graph $L_A$ of FIG. 7, an intercept of a tangent A coming in contact with the characteristic graph $L_A$ in a low frequency region thereof indicates the combined capacitance C.

Accordingly, the combined capacitance C of the fuel cell stack 1 at each anode gas concentration can be obtained from the intercept of a tangent A to D to the respective characteristic graph in the low frequency region as shown in FIG. 7 by broken lines. In a normal state where the anode gas concentration is high, the combined capacitance C is the electric double layer capacitance Cc (intercept of the tangent A) of the cathode electrode 113. As the anode gas concentration decreases due to the occurrence of an abnormality or the like, the combined capacitance C (intercepts of the tangents B to D) approaches the series combined capacitance ($C_a C_c/(C_a+C_c)$). As just described, the combined capacitance C of the fuel cell stack 1 decreases as the anode gas concentration decreases.

As described above, the combined capacitance of the fuel cell stack 1 at each anode gas concentration can be obtained from the intercept of the tangent in the low frequency region, to the characteristic graph shown by the solid line of FIG. 7. However, actual measurement values at a plurality of frequencies are necessary to draw tangents to the characteristic graphs of solid lines $L_A$ to $L_D$.

Accordingly, the fuel cell system 100 according to the present embodiment is configured to calculate a value of $-1/(\omega \cdot Zim)$ at one combined capacitance determining frequency f set in advance as the combined capacitance of the fuel cell stack 1.

As shown in FIG. 7, in terms of the characteristic graphs (solid lines $L_A$ to $L_D$) at each anode gas concentration prepared in advance and the tangents (broken lines A to D) to the respective characteristic graphs, the combined capacitance determining frequency f is set on the basis of frequencies $f_A$ to $f_D$ at each anode gas concentration obtained from values of the characteristic graphs on the abscissa at points where values of the characteristic graphs on the ordinate are equal to values of the intercepts of the tangents corresponding to the characteristic graphs. Specifically, an average value, a median value or the like of the frequencies $f_A$ to $f_D$ at each anode gas concentration is set as the combined capacitance determining frequency f. The combined capacitance determining frequency f is a frequency (several Hz to several hundreds of Hz) lower than the wetness degree determining frequency (e.g. 1 kHz) for the calculation of the wetness degree determining internal impedance HFR. Then, a value of $-1/(\omega \cdot Zim)$ at the combined capacitance determining frequency f set in this way can be regarded as the combined capacitance of the fuel cell stack 1 within an allowable error range.

The calculation process of the combined capacitance C of the fuel cell stack 1 performed in S103 and S106 of FIG. 5 is described with reference to FIG. 8. The combined capacitance C calculation process is based on the alternating-current impedance method.

In S301, the controller 6 controls the DC/DC converter 56 such that an output current and an output voltage output from the fuel cell stack 1 include alternating-current signals with the combined capacitance determining frequency f.

In S302, the controller 6 calculates a current amplitude value at the combined capacitance determining frequency by applying a known Fourier transform processing to an output current value (alternating-current value) detected by the current sensor 51.

In S303, the controller 6 calculates a voltage amplitude value at the combined capacitance determining frequency by applying a known Fourier transform processing to an output voltage value (alternating-voltage value) detected by the voltage sensor 52.

In S304, the controller 6 calculates the combined capacitance determining internal impedance Z by dividing the voltage amplitude value calculated in S303 by the current amplitude value calculated in S302.

In S305, the controller 6 calculates a phase delay θ of the output voltage value with respect to the output current value after having applied a Fourier transform processing to the output current value detected by the current sensor 51 and the output voltage value detected by the voltage sensor 52.

In S306, the controller 6 calculates the imaginary-part component Zim of the combined capacitance determining internal impedance Z on the basis of the combined capacitance determining internal impedance Z and the phase delay θ.

In S307, the controller 6 calculates the combined capacitance C of the fuel cell stack 1 correlated with the anode gas concentration through equation (7) from the combined capacitance determining frequency f and the imaginary-part component Zim of the combined capacitance determining internal impedance. After a processing of S307, the controller 6 finishes the combined capacitance C calculation process.

$$C = -\frac{1}{\omega \cdot Z_{im}} \quad (7)$$

$$\omega = 2\pi f$$

The combined capacitance C of the fuel cell system 1 calculated in S307 is used to judge the state of the anode gas concentration in S104 and S107 of the management control of FIG. 5.

According to the fuel cell system 100 of the present embodiment described above, the following effects can be obtained.

The fuel cell system 100 includes the fuel cell stack 1 for generating electrical power upon being supplied with the anode gas and the cathode gas and the controller 6 for controlling a state of power generation and the like of the fuel cell stack 1. The controller 6 includes a wetness control state determination unit (S102) that determines whether or not the wetness control of controlling the degree of wetness of the electrolyte membranes 111 is normally executed and a combined capacitance calculation unit (S103) that calculates the combined capacitance of the fuel cell stack 1. Furthermore, the controller 6 includes an anode gas concentration control unit (S105) that determines that the anode gas concentration in the fuel cell stack 1 has decreased or executes the control for increasing the anode gas concentration if the combined capacitance is smaller than the predetermined value when the wetness control is determined to be normally executed. As just described, since the state of the anode gas concentration is detected on the basis of the combined capacitance of the fuel cell stack 1 if the wetness control is normally executed, the state of the anode gas concentration can be detected in distinction from the degree of wetness of the electrolyte membranes 111. As a result, it is possible to more reliably execute a determination on decrease in the anode gas concentration and a control for recovery (increase) of the anode gas concentration.

In the case of determining the decrease of the anode gas concentration, it is possible to notify that the fuel cell stack 1 is in a state where the anode gas concentration is low or stop the operation of the fuel cell system 100. On the other hand, in the case of executing the recovery control of the anode gas concentration, power generation efficiency and the like of the fuel cell stack 1 can be recovered.

Conventionally, it is known that a change of an anode gas concentration can be detected as a change of an output voltage of a fuel cell or the like. However, in the fuel cell system 100, a change amount of a combined capacitance based on an anode gas concentration change is larger than a change amount of the output voltage based on the anode gas concentration change. Thus, by detecting the state of the anode gas concentration on the basis of the combined capacitance of the fuel cell stack 1 as in the aforementioned embodiment of the fuel cell system 100, the state of the anode gas concentration can be accurately detected.

Furthermore, the controller 6 includes an output control unit (S201, S301) that controls the output of the fuel cell stack 1 such that an output current and an output voltage of the fuel cell stack 1 include alternating-current signals with a predetermined frequency, and an impedance calculation unit (S204, S304) that calculates the internal impedance of the fuel cell stack 1. Then, the controller 6 determines the state of the wetness control on the basis of the wetness degree determining internal impedance HFR calculated from the output current and the output voltage of the fuel cell stack 1 at the wetness degree determining frequency. Moreover, the controller 6 calculates the combined capacitance C of the fuel cell stack 1 on the basis of the combined capacitance determining internal impedance calculated from the output current and the output voltage of the fuel cell stack 1 at the combined capacitance determining frequency set to be lower than the wetness degree determining frequency. Since the frequencies for measurements in the alternating-current impedance method are separately used as the wetness degree determining frequency and the combined capacitance determining frequency in this way, the state of the wetness control and the state of the anode gas concentration can be detected in distinction from each other.

The controller 6 calculates the combined capacitance C of the fuel cell stack 1 through equation (7) described above if f denotes the combined capacitance determining frequency and Zim denotes the imaginary-part component of the combined capacitance determining internal impedance. Thus, according to the fuel cell system 100, the combined capacitance C of the fuel cell stack 1 can be easily and quickly calculated using the combined capacitance determining frequency f and the imaginary-part component Zim of the combined capacitance determining internal impedance.

Here, in terms of the characteristic graphs at each anode gas concentration prepared in advance with the abscissa representing $1/\omega^2$ and the ordinate representing $-1/(\omega \cdot Zim)$ and the tangents to the characteristic graphs coming in contact with the characteristic graphs in the low frequency regions thereof, the combined capacitance determining frequency f is set on the basis of the frequencies at each anode gas concentration obtained from the values of the characteristic graphs on the abscissa at the points where the values of the characteristic graphs on the ordinate are equal to the values of the intercepts of the tangents corresponding to the characteristic graphs. More specifically, an average value, a median value or the like of the frequencies at each anode gas concentration is set as the combined capacitance determining frequency f. By using one combined capacitance determining frequency f set in this way and the imaginary-part component Zim of the combined capacitance determining internal impedance, the combined capacitance C of the fuel cell stack 1 can be easily and quickly calculated.

The controller 6 executes the recovery control (increase control) of the anode gas concentration and the control of increasing the degree of wetness of the electrolyte membranes 111 of the fuel cell stack 1 if the combined capacitance of the fuel cell stack 1 is smaller than the predetermined value when the wetness control is determined to be failed. If the combined capacitance of the fuel cell stack 1 decreases during the occurrence of failure in the wetness control, it is not possible to discriminate whether the degrease of the combined capacitance is due to the decrease of the degree of wetness or the decrease of the anode gas concentration. Thus, by simultaneously executing both the wetness degree recovery control and the anode gas concentration recovery control, the operation of the fuel cell system 100 can be continued even in a state where the cause of the decrease in the anode gas concentration cannot be clearly discriminated.

Although the embodiment of the present invention has been described above, the above embodiment is merely an illustration of one application example of the present invention and not intended to limit the technical scope of the present invention to the specific configuration of the above embodiment.

The controller 6 of the fuel cell system 100 of the present embodiment is configured to detect a failure of the wetness control using the wetness degree determining internal impedance. However, the controller 6 may be configured to detect a failure of the wetness control using other pieces of state information of the fuel cell system 100.

Furthermore, FIG. 8 shows an example of the calculation of the combined capacitance C of the fuel cell stack 1 and the calculation of the combined capacitance C is not limited to the technique of FIG. 8.

This application claims a priority based on the patent application No. 2014-015772 filed on Jan. 30, 2014, the entire contents of which are incorporated herein by reference.

The invention claimed is:

1. A fuel cell system with a fuel cell for generating electrical power upon being supplied with anode gas and cathode gas, comprising:
a wetness control state determination unit configured to determine whether or not a wetness control for controlling a degree of wetness of an electrolyte membrane of the fuel cell is normally executed;
a combined capacitance calculation unit configured to calculate a combined capacitance of the fuel cell; and
an anode gas concentration control unit configured to:
execute a control for increasing the anode gas concentration when the combined capacitance of the fuel cell is smaller than a predetermined value when the wetness control is determined to be normally executed.

2. The fuel cell system according to claim 1, further comprising:
an output control unit configured to control an output of the fuel cell such that an output current and an output voltage of the fuel cell have alternating-current signals with a predetermined frequency; and
an impedance calculation unit configured to calculate an internal impedance of the fuel cell on the basis of the output current and the output voltage of the fuel cell at the predetermined frequency;
wherein:
the wetness control state determination unit determines a state of the wetness control on the basis of an internal impedance calculated from the output current and the output voltage of the fuel cell at a wetness degree determining frequency; and
the combined capacitance calculation unit calculates the combined capacitance of the fuel cell on the basis of an internal impedance calculated from the output current and the output voltage of the fuel cell at a combined capacitance determining frequency set to be lower than the wetness degree determining frequency.

3. The fuel cell system according to claim 2, wherein:
the combined capacitance calculation unit calculates the combined capacitance C of the fuel cell by equation (1) where f denotes the combined capacitance determining frequency and $Z_{im}$ denotes an imaginary-part component of the internal impedance at the combined capacitance determining frequency f:

$$C = -\frac{1}{\omega \cdot Z_{im}} \quad (1)$$
$$\omega = 2\pi f.$$

4. The fuel cell system according to claim 3, wherein:
in terms of characteristic graphs at each anode gas concentration with an abscissa representing $1/\omega^2$ and an ordinate representing $-1/(\omega \cdot Z_{im})$ and tangents that come in contact with the respective characteristic graphs in a low frequency region thereof, in which a change in $-1/(\omega \cdot Z_{im})$ per unit increase amount of $1/\omega^2$ becomes substantially constant, the combined capacitance determining frequency is set on the basis of frequencies at each anode gas concentration obtained from values of the characteristic graphs on the abscissa at points where values of the characteristic graphs on the ordinate are equal to values of intercepts of the tangents corresponding to the characteristic graphs.

5. The fuel cell system according to claim 1, wherein:
the anode gas concentration control unit executes the control for increasing the anode gas concentration and also executes a control for increasing the degree of wetness of the electrolyte membrane of the fuel cell when the combined capacitance of the fuel cell is smaller than the predetermined value when the wetness control is determined not to be normally executed.

6. A fuel cell system with a fuel cell for generating electrical power upon being supplied with anode gas and cathode gas, comprising:
a wetness control state determination unit configured to determine whether or not a wetness control for controlling a degree of wetness of an electrolyte membrane of the fuel cell is normally executed;
a combined capacitance calculation unit configured to calculate a combined capacitance of the fuel cell; and
an anode gas concentration control unit configured to:
determine that an anode gas concentration in the fuel cell has decreased, and
execute a control for increasing the anode gas concentration when the combined capacitance of the fuel cell is smaller than a predetermined value when the wetness control is determined to be normally executed.

7. The fuel cell system according to claim 1, further comprising:
an impedance calculation unit configured to calculate an internal impedance of the fuel cell on the basis of an output current and an output voltage of the fuel cell at a predetermined frequency;
wherein:
the wetness control state determination unit determines a state of the wetness control on the basis of an internal impedance calculated from the output current and the output voltage of the fuel cell at a wetness degree determining frequency; and
the wetness control state determination unit determines that the wetness control for controlling the degree of wetness of the electrolyte membrane of the fuel cell is normally executed when the internal impedance calculated at the wetness degree determining frequency is a value within a predetermined range.

8. The fuel cell system according to claim 1, wherein:
the anode gas concentration control unit is configured to execute a control for increasing the degree of wetness of the electrolyte membrane of the fuel cell and does not execute the control for increasing the anode gas concentration when the combined capacitance of the fuel cell is larger than the predetermined value when the wetness control is determined not to be normally executed.

9. The fuel cell system according to claim 1, wherein:
the anode gas concentration control unit is configured to execute the control for increasing the anode gas concentration and to not execute a control for increasing the degree of wetness of the electrolyte membrane of the fuel cell when the combined capacitance of the fuel cell is smaller than the predetermined value when the wetness control is determined to be normally executed, the anode gas concentration control unit is configured to execute both the control for increasing the anode gas concentration and the control for increasing the degree of wetness of the electrolyte membrane of the fuel cell when the combined capacitance of the fuel cell is smaller than the predetermined value when the wetness control is determined not to be normally executed, and the anode gas concentration control unit is configured to execute the control for increasing the degree of wetness of the electrolyte membrane of the fuel cell and to not execute the control for increasing the anode gas concentration when the combined capacitance of the fuel cell is larger than the predetermined value when the wetness control is determined not to be normally executed.

* * * * *